(12) United States Patent
Ferrant

(10) Patent No.: US 7,130,206 B2
(45) Date of Patent: Oct. 31, 2006

(54) CONTENT ADDRESSABLE MEMORY CELL INCLUDING RESISTIVE MEMORY ELEMENTS

(75) Inventor: Richard Ferrant, Esquibien (FR)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 0 days.

(21) Appl. No.: 10/955,836

(22) Filed: Sep. 30, 2004

(65) Prior Publication Data

US 2006/0067098 A1    Mar. 30, 2006

(51) Int. Cl.
*G11C 15/00* (2006.01)
*G11C 11/00* (2006.01)

(52) U.S. Cl. .......................................... 365/49; 365/158

(58) Field of Classification Search .................. 365/49, 365/158, 171, 173
See application file for complete search history.

(56) References Cited

U.S. PATENT DOCUMENTS 6,269,016 B1 * 7/2001 Moyer ......................... 365/49
6,304,477 B1 * 10/2001 Naji ............................ 365/158
6,515,897 B1 * 2/2003 Monsma et al. ............. 365/173
6,819,585 B1 * 11/2004 Fujita et al. ................. 365/158
6,944,050 B1 * 9/2005 Kang et al. .................. 365/158

* cited by examiner

*Primary Examiner*—Trong Phan
(74) *Attorney, Agent, or Firm*—Dicke, Billig & Czaja, PLLC

(57) ABSTRACT

A content addressable memory cell is described. In one embodiment, the content addressable memory cell includes first and second resistive memory elements being coupled in a first series connection and being connected between a first potential value and a second potential value being smaller than said first potential value, and means for their switching between states exhibiting different electric resistance values. The memory cell includes a first field effect transistor and a second field effect transistor, said first and second transistors having drain-source-paths and gate electrodes, said drain-source-paths of said first and second transistors being connected in a second series connection and being connected to at least one of first current lines. The first current line is connected to a potential value level detector for sensing a potential difference as to said third potential value.

19 Claims, 3 Drawing Sheets

(0 ,0)

(0 ,1)

CONTENT ADDRESSABLE MEMORY CELL INCLUDING RESISTIVE MEMORY ELEMENTS

FIELD OF THE INVENTION

This invention is in the field of non-volatile semiconductor memory chips and more particularly relates to a content addressable memory cell.

BACKGROUND

In the modern communication industry there is often a need to determine associative relationships between data elements. In order to meet this need, a content addressable memory (CAM) is used to make a comparison of an input data value and a stored data value in the CAM cell. For example, a CAM cell array contained within a network router would determine whether there is an association between the address in the packet header and the addresses of the computers in the network. In determining the association, a search and comparison method must be performed between the address in the packet header and all the addresses in the network. This search and comparison is both time and resource intensive using traditional solutions involving convenient RAM-technology. Contrary to that, CAM-technology provides much faster search and compare operations.

More particularly, a CAM is a memory device with two modes of access. In one mode, the CAM works as a normal random access memory, wherein the contents of the memory are read and written at specified addresses. In a second mode, the CAM compares the specified string, often called the comparand with the information stored in its memory cells and then generates signals which indicate if a match between the comparand and any of the information in the memory was found.

Typical circuitry of a 10 transistor-SRAM based CAM-cell includes a standard 6 Transistor-SRAM cell for storage and a 4 Transistor-comparator. Both of these functions use a relatively large area because of the large number of devices connected on very few internal nodes (need for several metal levels to insure interconnections as for instance each storage node is connected to 6 transistors, only 2 adjacent devices can be efficiently connected together without area consuming interconnections). Additionally, a very poor balance between the number of P-channels (2T) and N-channels (8T) forces an imperfect layout with some empty spots. Typically, such circuitry requires much area per memory cell.

In view of the above, there is a need to provide a CAM cell allowing a further memory cell size down-scale as compared to conventional CAM cells.

SUMMARY

The present invention provides for a content addressable memory cell. In one embodiment, the content addressable memory cell includes a first and second resistive memory elements for reduced memory cell size.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
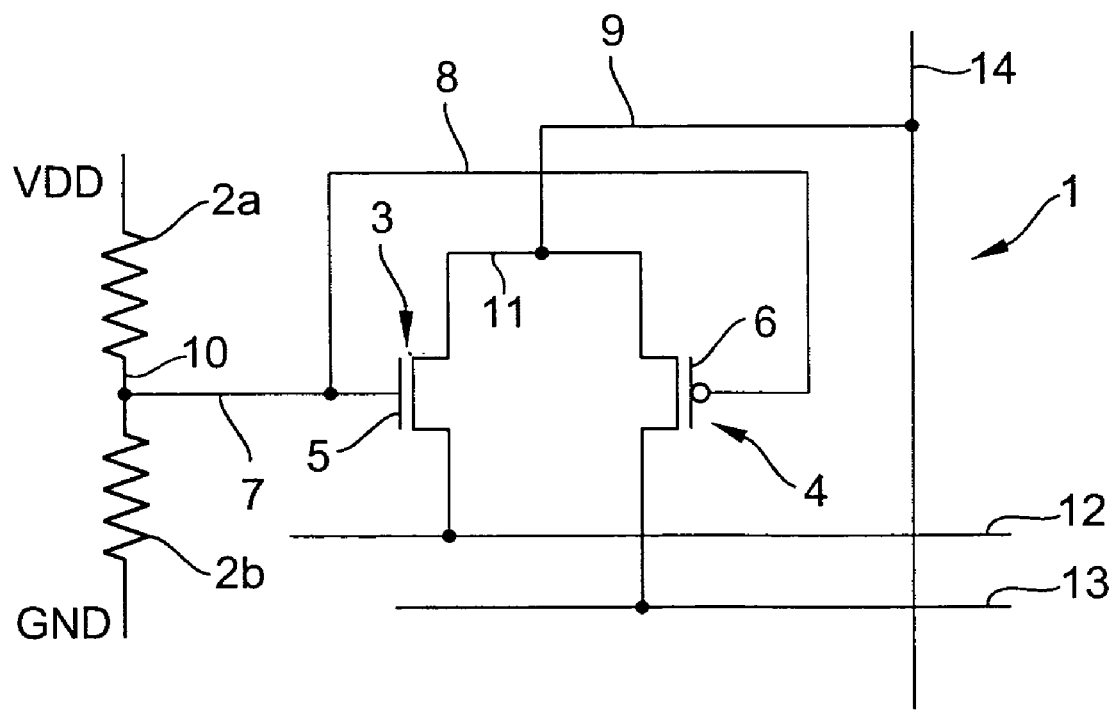
FIG. 1 is a circuit diagram illustrating one embodiment of a CAM-cell of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to one embodiment of the invention, the present invention provides a content addressable memory (CAM) cell, which includes a first resistive memory element and a second resistive memory element, which are coupled in a first series connection, which is connected between a first potential value (VDD) and a second potential value (GND) being smaller than said first potential value, and which may be ground.

Throughout this specification, the term "resistive memory element" is used to describe memory elements of any kind, which can be brought into two or more states exhibiting different electrical resistance values, such as magneto-resistive memory cells including magnetic tunnel junctions as used in convenient MRAMs, phase change memory cells using some sort of a phase change material and conductive bridging memory cells using some sort of a solid state electrolyte in combination with an ion donor electrode.

For switching the first and second resistive memory elements into at least two states exhibiting different electrical resistance values, the memory cell according to one embodiment of the invention further includes a switch, switch mechanism or means for switching the resistive memory elements into different states exhibiting different electrical resistance values.

The memory cell also includes a first field effect transistor (FET) being a P-channel transistor and a second field effect transistor being an N-channel transistor, both of which are provided with drain-source-paths and gate electrodes as is typical in FET-technology. The drain-source-paths of the first and second transistors are connected in a second series connection and are further connected to at least one of first current lines. The first current line(s) is/are precharged to a third potential value, which is chosen to be smaller than the first potential value and larger than the second potential value, and further is/are connected to a potential value level detector for sensing a potential difference as to the third potential value. The first current lines are also referred to as "match lines".

Each memory cell further comprises a second current line, which is connected to the second series connection of transistors at a location between the first and second transistors. The second current line may for instance be identified as "bit line". Having only one match line connected to both transistors, a typical ternary XOR logic output may be realized. In another embodiment of the invention, each one of the first and second transistors may be connected to a separate one of the first current lines. In the latter case a typical binary XOR logic output may be realized.

According to one embodiment of the invention, the storage is made in the two resistive memory elements that can be programmed through means for their switching into different states exhibiting different electric resistance values. More particularly, the programmation in the two opposite states of the two resistive memory elements is used to move up and down the middle point and then the logic comparison is operated into the transistor.

In case the memory cells are chosen to be magnetoresistive memory cells, the resistive memory elements are formed as magnetic tunnel junctions (MTJs), each one of which typically includes first and a second magnetic layers made of magnetic material stacked in parallel, overlying relationship and separated by a layer of nonmagnetic material, wherein the second magnetic layer is provided with a magnetically fixed magnetization, while the first magnetic layer is provided with a free magnetization being free to be switched between the same and opposite directions with respect to the fixed magnetization direction of the second magnetic layer. In that case, the above means for switching between states exhibiting different electric resistance values may be realized as a pair of current lines especially crossing at right angles with the MTJ being provided at their intersection.

In light of the above, the present invention provides a CAM-cell allowing a further memory cell size down-scale as compared to convenient CAM-cells.

FIG. 1 illustrates one embodiment of a CAM cell 1 according to the invention. Based on conventional MRAM memory elements, each one of the resistive memory elements 2a, 2b of the invention's CAM cell 1 comprises a magnetic tunnel junction (MTJ) as well as respective portions of first, second and third current lines. Each MTJ includes free and reference layers made of a magnetic material stacked in parallel, overlying relationship and separated by a layer of nonmagnetic material. The magnetization of each one of the free layers is magnetically coupled to current lines (not illustrated in the drawings) for its switching in parallel or antiparallel states with respect to the magnetization of the reference layer, wherein both magnetic fields of the current lines mutually act on the easy axis magnetization of the MTJ, which typically is positioned at an intersection thereof. Each MTJ may have different resistance values (R0, R1) on account of its different switching states. Both resistive memory elements 2a, 2b are connected together in a (first) series connection 10 and further are connected between a first potential value (VDD) and a reference potential, ground (GND).

In FIG 1, the memory cell 1 further comprises a first field effect transistor (FET) 4, which is chosen to be a P-channel transistor, and a second FET 3, which is chosen to be an N-channel transistor. Both transistors are provided with drain-source-paths and gate electrodes 6, 5. The drain-source-paths of the transistors are connected together in a (second) series connection 11, wherein the drain-source-path of the first transistor 4 is connected to a separate match (current) line 13, while the drain-source-path of the second transistor 3 is connected to a separate match (current) line 12. Both match lines 13, 12 are precharged to a third potential value, which is chosen to be smaller than said first potential value and larger than said second potential value, and further, are connected to a potential value level detector (not illustrated in the drawings) for sensing a potential difference as to said third potential value. Both gate electrodes 6, 5 of the transistors 4, 3 are connected via lines 8 and 7, respectively, to the (first) series connection 10 of the resistive memory elements 2a, 2b at a location between both resistive memory elements 2a, 2b. The memory cell 1 further comprises a further current line 14, which is connected to the (second) series connection 11 of transistors 3, 4 at a location between the transistors via line 9. In this kind a binary XOR logic output is created.

Figure 2A:
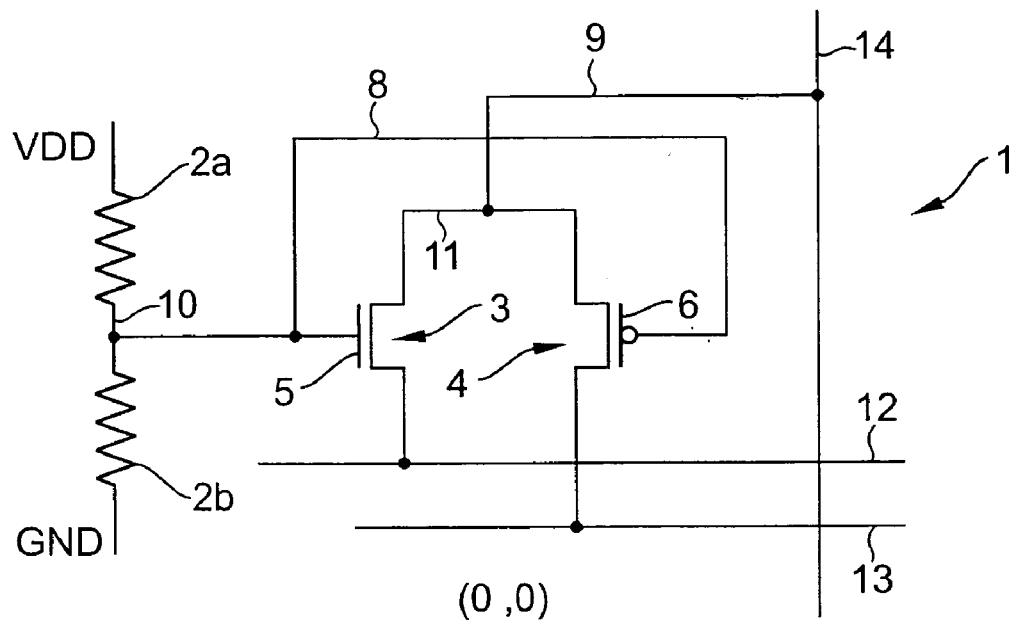
FIGS. 2A to 2D illustrate sensing of different logic states of the CAM cell of FIG. 1.
Figure 2B:
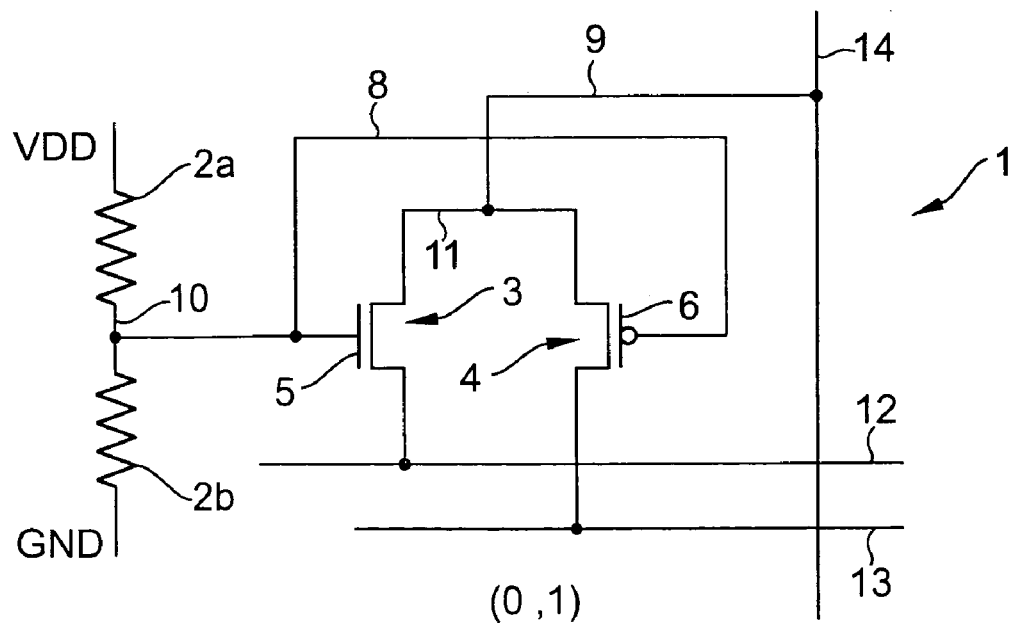
Figure 2C:
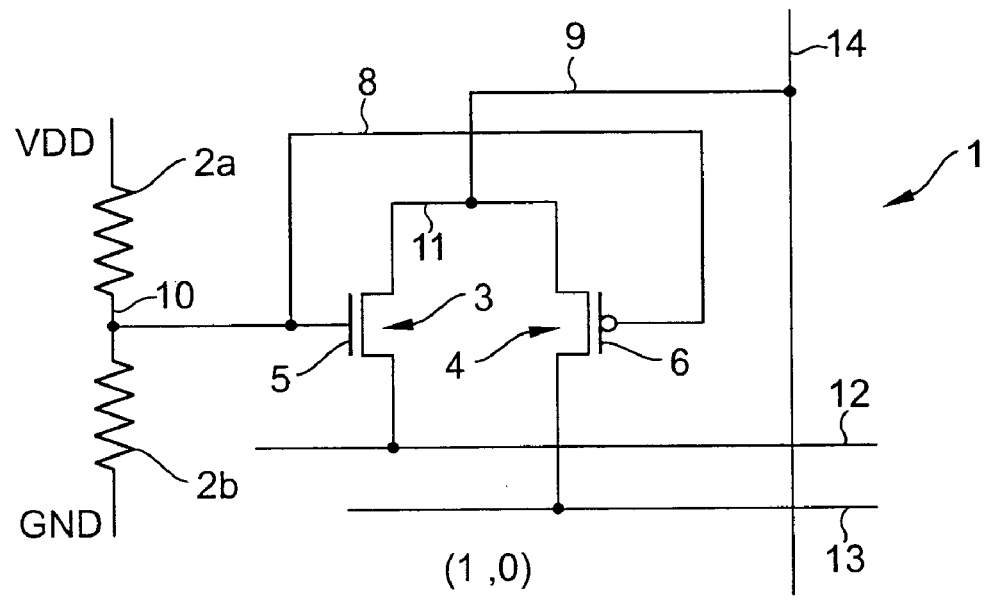
Figure 2D:
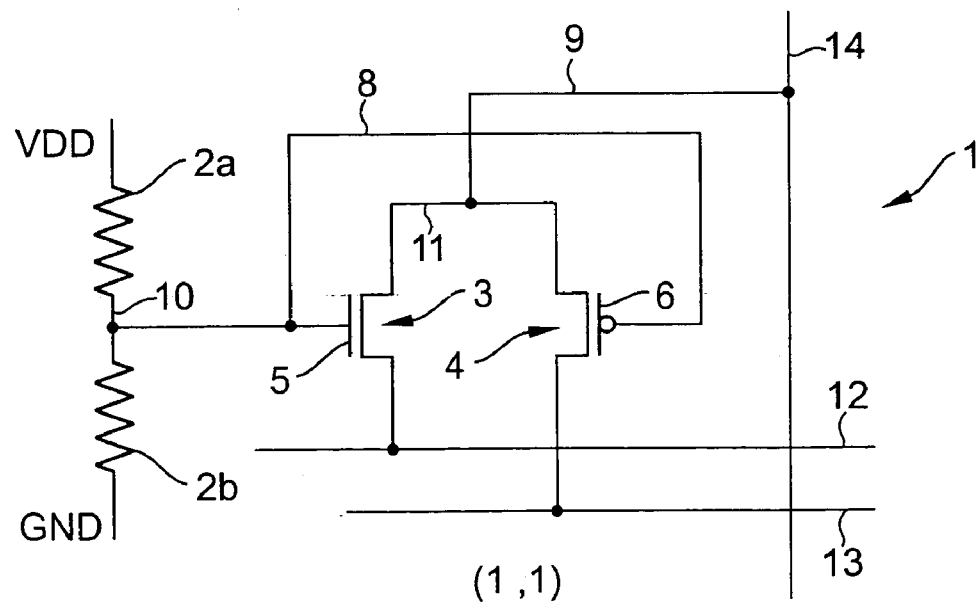

Now referring to FIGS. 2A through 2D, a method for sensing different logic states of the resistive memory elements 2a, 2b is illustrated. Reference is made to FIG. 2A, in which the logic state (0, 0) is stored in the resistive memory elements 2a, 2b. Starting from a situation wherein the first resistive memory cell 2a has been brought in a resistive state R1 and the second resistive memory cell 2b has been brought in a resistive state R0 different from R1, and applying a potential value VDD on one end of the series connection 10 of both resistive memory elements 2a, 2b and connecting the other end of the series connection 10 to ground GND leads to a potential value of VDD/2-δV applied to both gates 5, 6 of the transistors. Applying a potential value of VDD-ΔV to the current line 14 thus results in both transistors being in their off-states. Hence, no signal change at the precharged match lines 12, 13 is observed. Now, particular reference is made to FIG. 2B, in which the logic state (0, 1) is stored in the resistive memory elements 2a, 2b. Starting from a situation wherein the first resistive memory cell 2a has been brought in a resistive state R1 and the second resistive memory cell 2b has been brought in a resistive state R0 different from R1 and applying a potential value VDD on one end of the series connection of both resistive memory elements 2 and connecting the other end of the series connection 10 to ground GND again leads to a potential value of VDD/2-δV applied to both gates 5, 6 of the transistors. Applying a potential value of VDD+ΔV to the current line 14 thus results in the first transistor 4 (which is a P-channel transistor) being in its on-state, while the second transistor 3 (which is an N-channel transistor) being in its off-state. Hence, a signal rise at the precharged match line 13 is observed. Now, with particular reference to FIG. 2C the logic state (1, 0) is stored in the resistive memory elements 2a, 2b. Starting from a situation wherein the first resistive memory cell 2a has been brought in a resistive state R0 and the second resistive memory cell 2b has been brought in a resistive state R1 different from R0. and applying a potential value VDD to the series connection of both resistive memory elements 2a, 2b leads to a potential value of VDD/2+δV applied to both gates 5, 6 of the transistors. Applying a potential value of VDD−ΔV to the current line 14 thus results in the first transistor 4 being in its off-state, while the second transistor 3 is in its on-state. Hence, a signal drop at the precharged match line 12 is observed. Finally, reference is made to FIG. 2D, in which the logic state (1, 1) is stored in the resistive memory elements 2a, 2b. Starting from a situation wherein the first resistive memory cell 2a has been brought in a resistive state R0 and the second resistive memory cell 2b has been brought in a resistive state R1 different from R0, and applying a potential value VDD to the series connection of both resistive memory elements 2a, 2b again leads to a potential value of VDD/2+δV applied to both gates 5, 6 of the transistors. Applying a potential value of VDD+ΔV to the current line 14 thus results in both transistors 3, 4 being in their off-states and no signal change is observed in the match lines 12, 13.

It thus becomes apparent, that when information stored in the pair of resistive memory elements 2a, 2b are identical to information proposed on line 14, none of the two match 12, 13 moves. Otherwise, if information is different, one of the match lines 12, 13 is pulled up or down. A simple detection of the change of the match lines 12, 13 hence indicates a mismatch.

Using MRAM resistive memory elements on top of the transistors reduces the cell area by a factor at least equivalent to the transistor count ratio (cell interconnections being also much simpler and help to attain further area gains). Immediate use of MRAM-CAM-cells may be envisioned for search engines, redundancy on MRAMs, store repaired addresses and instantaneously recognize them without any power-up sequence.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A content addressable memory cell comprising:
   a first resistive memory element and a second resistive memory element being able to be brought into states exhibiting different resistance values and being coupled in a first series connection, the first series connection of the resistive memory elements being connected between a first potential value and a second potential value being smaller than said first potential value; and
   a first field effect transistor being a P-channel transistor and a second field effect transistor being an N-channel transistor having a common connection to the first resistive memory element and the second resistive memory element of the content addressable memory cell.

2. The memory cell of claim 1,
   wherein the first and second PET transistors having drain-source-paths and gate electrodes, the drain-source-paths of the first and second transistors being connected in a second series connection and being connected to at least one of first current lines, said first current lines being precharged to a third potential value being smaller than said first potential value and being larger than said second potential value.

3. The memory cell of claim 2, further comprising:
   a second current line being connected to the second series connection of transistors between the first and second transistors.

4. The memory cell of claim 3, wherein each one of the first and second transistors is connected to a separate one of the first current lines.

5. The memory cell of claim 3, wherein the second potential value is zero.

6. The memory cell of claim 1, wherein the resistive memory elements are magneto-resistive memory elements.

7. The memory cell of claim 1, wherein the first resistive memory element comprises a first phase change memory element and the second resistive memory element comprises a second phase change memory element.

8. The memory cell of claim 1, wherein the first resistive memory element comprises a first conductive bridging memory element and the second resistive memory element comprises a second conductive bridging memory element.

9. A content addressable magnetic memory cell comprising:
   a first resistive magnetic memory element and a second resistive magnetic memory element being able to be brought into states exhibiting different resistance values and being coupled in a first series connection;
   a first transistor being a P-channel transistor and a second transistor being an N-channel transistor, the first and second transistors having drain-source-paths and gate electrodes, the drain-source-paths of the first and second transistors being connected in a second series connection and being connected to at least one of first current lines, said first current lines being precharged to a third potential value being smaller than said first potential value and being larger than said second potential value; and
   a second current line being connected to the second series connection of transistors between the first and second transistors.

10. The memory cell of claim 9, wherein each one of the first and second transistors is connected to a separate one of the first current lines.

11. The memory cell of claim 9, wherein the second potential value is zero.

12. A memory cell comprising:
   a voltage divider configured to provide a first voltage, the voltage divider including a first resistive memory element and a second resistive memory element, the first resistive memory element and the second resistive memory element configured to be set to different logic states,
   a first transistor configured to turn on in response to the first voltage exceeding a first value to provide a first signal; and
   a second transistor configured to turn on in response to the first voltage exceeding a second value greater than the first value to provide a second signal,
   wherein the first signal and the second signal indicate a logic state of the first resistive memory element and the second resistive memory element.

13. The memory of claim 12, wherein the first resistive memory element comprises a first phase change memory element and the second resistive memory element comprises a second phase change memory element.

14. The memory of claim 12, wherein the first resistive memory element comprises a first magneto-resistive memory element and the second resistive memory element comprises a second magneto-resistive memory element.

15. The memory of claim 12, wherein the first resistive memory element comprises a first conductive bridging memory element and the second resistive memory element comprises a second conductive bridging memory element.

16. A method for sensing the state of a memory cell, the method comprising:
   dividing a first voltage between a first resistive memory element and a second resistive memory element to provide a second voltage, the first resistive memory element and the second resistive memory element configured to be set to different logic states;

providing a first signal in response to the second voltage exceeding a first value; and providing a second signal in response to the second voltage exceeding a second value, wherein the first signal and the second signal indicate a logic state of the first resistive memory element and the second resistive memory element wherein providing the first signal comprises turning on a first transistor in response to the second voltage exceeding the first value; and wherein providing the second signal comprises turning on a second transistor in response to the second voltage exceeding the second value.

17. The method of claim 16, wherein the first resistive memory element comprises a first phase change memory element and the second resistive memory element comprises a second phase change memory element.

18. The method of claim 16, wherein the first resistive memory element comprises a first magneto-resistive memory element and the second resistive memory element comprises a second magneto-resistive memory element.

19. The method of claim 16, wherein the first resistive memory element comprises a first conductive bridging memory element and the second resistive memory element comprises a second conductive bridging memory element.

* * * * *